US011501169B1

(12) United States Patent
Schubert et al.

(10) Patent No.: US 11,501,169 B1
(45) Date of Patent: Nov. 15, 2022

(54) COMPRESSED FIELD RESPONSE REPRESENTATION FOR MEMORY EFFICIENT PHYSICAL DEVICE SIMULATION

(71) Applicant: X Development LLC, Mountain View, CA (US)

(72) Inventors: Martin Schubert, Mountain View, CA (US); Brian Adolf, San Mateo, CA (US); Jesse Lu, Hollister, CA (US)

(73) Assignee: X Development LLC, Mountain View, CA (US)

( * ) Notice: Subject to any disclaimer, the term of this patent is extended or adjusted under 35 U.S.C. 154(b) by 869 days.

(21) Appl. No.: 16/398,697

(22) Filed: Apr. 30, 2019

(51) Int. Cl.
*G06F 17/14* (2006.01)
*G06T 11/00* (2006.01)
(Continued)

(52) U.S. Cl.
CPC ........... *G06N 3/084* (2013.01); *G06F 3/0664* (2013.01); *G06F 17/14* (2013.01); *G06F 30/20* (2020.01);
(Continued)

(58) Field of Classification Search
CPC .......... G06F 30/00; G06F 30/17; G06F 30/20; G06F 30/23; G06F 2111/10;
(Continued)

(56) References Cited

U.S. PATENT DOCUMENTS 5,774,693 A    6/1998   Hsu et al.
6,772,076 B2   8/2004   Yamamoto et al.
(Continued)

FOREIGN PATENT DOCUMENTS

CN     109996728 A   *   7/2019   ................ G01J 1/44
WO   2017/176370 A1    10/2017
WO   2017/223560 A1    12/2017

OTHER PUBLICATIONS

Giorgia Parca, Pedro Teixeira, and Antonio Teixeira, "All-optical image processing and compression based on Haar wavelet transform," Appl. Opt. 52, 2932-2939 (2013) (Year: 2013).*
(Continued)

*Primary Examiner* — Eunhee Kim
(74) *Attorney, Agent, or Firm* — Christensen O'Connor Johnson Kindness PLLC

(57) ABSTRACT

A method of optimizing structural parameters of a physical device includes: receiving an initial description of the physical device that describes the physical device with an array of voxels that each describe one or more of the structural parameters; performing a time-forward simulation of a field response propagating through the physical device and interacting with the voxels in a simulated environment, wherein the field response is influenced by the structural parameters of the voxels; generating field response values describing the field response at each of the voxels for each of a plurality of time steps; encoding the field response values to generate compressed field response values; storing the compressed field response values; decoding one or more of the compressed field response values to extract regenerated field response values; and generating a revised description of the physical device having a structural parameter optimized.

24 Claims, 8 Drawing Sheets

(51) Int. Cl.
*G06F 30/20* (2020.01)
*G06N 3/08* (2006.01)
*G06N 3/04* (2006.01)
*G06F 3/06* (2006.01)

(52) U.S. Cl.
CPC .......... *G06N 3/0418* (2013.01); *G06T 11/008* (2013.01)

(58) Field of Classification Search
CPC ....... G06F 3/0664; G06T 17/00; G06T 17/14; G06T 11/008; G06N 3/0418; G06N 3/084
See application file for complete search history.

(56) References Cited

U.S. PATENT DOCUMENTS

| | | | |
|---|---|---|---|
| 6,804,446 B1* | 10/2004 | Nordin | G02B 6/1225 385/125 |
| 9,589,757 B1 | 3/2017 | Hannon et al. | |
| 2004/0225483 A1 | 11/2004 | Okoniewski et al. | |
| 2010/0312539 A1 | 12/2010 | Yamagajo et al. | |
| 2014/0365188 A1 | 12/2014 | Doerr | |
| 2016/0012176 A1 | 1/2016 | Liu et al. | |
| 2016/0033765 A1 | 2/2016 | Liu et al. | |
| 2016/0174902 A1 | 6/2016 | Georgescu et al. | |
| 2018/0018757 A1 | 1/2018 | Suzuki | |
| 2018/0045953 A1* | 2/2018 | Fan | G02B 5/18 |
| 2018/0199066 A1* | 7/2018 | Ross | H04N 19/625 |

OTHER PUBLICATIONS

Hassan, E., Noreland, D., Wadbro, E. et al. Topology Optimisation of Wideband Coaxial-to-Waveguide Transitions. Sci Rep 7, 45110 (2017). https://doi.org/10.1038/srep45110. (Year: 2017).*

Chen, R.T. et al., "Neural Ordinary Differential Equations", 32nd Conference on Neural Information Processing Systems (NIPS 2018), Oct. 22, 2018, 18 pages.

Petykiewicz, J. et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.

Ying-Shou Lu, J., "Nanophotonic Computational Design", A Dissertation Submitted to the Department of Electrical Engineering and the Committee on Graduate Studies of Stanford University, Jun. 2013, 122 pages.

Piggott, A.Y., "Automated Design of Photonic Devices", A Dissertation Submitted to the Department of Electrical Engineering and the Committee on Graduate Studies of Stanford University, Jun. 2018, 112 pages.

Lu, J. et al., "Nanophotonic Computational Design", Optics Express, vol. 21, No. 11, Jun. 3, 2013, 17 pages.

Piggott, A. Y. et al., "Inverse Design and Implementation of a Wavelength Demultiplexing Grating Coupler", Scientific Reports, Nov. 27, 2014, 5 pages.

Piggott, A.Y. et al., "Inverse Design and Demonstration of a Compact and Broadband On-Chip Wavelength Demultiplexer", Nature Photonics, May 11, 2015, 5 pages.

Piggott, A.Y. et al., "Silicon Photonics: Design Approach to Integrated Photonics Explores Entire Space of Fabricable Devices", Laser Focus World, Aug. 13, 2018, 5 pages.

Piggott, A. Y. et al., "Fabrication-constrained Nanophotonic Inverse Design", Scientific Reports, May 11, 2017, 7 pages.

Su, L. et al., "Inverse Design and Demonstration of a Concept On-Chip Narrowband Three-Channel Wavelength Demultiplexer", ACS Photonics, Aug. 17, 2017, 6 pages.

Su, L. et al.,Fully-Automated Optimization of Grating Couplers', Optics Express, vol. 26, No. 4m Feb. 2018, 12 pages.

Robinson, J.T., "First-Principle Derivation of Gain in High-Index-Contrast Waveguides", Optics Express, vol. 16, No. 21, Oct. 13, 2008, 11 pages.

Lalau-Keraly, C.M. et al., "Adjoint Shape Optimization Applied to Electromagnetic Design", Optical Society of America, 2013, 9 pages.

Key Frame Wikipedia page, retrieved from internet <https:/en.wikipedia/Key_Frame> on Nov. 6, 2018, 2 pages.

Motion JPEG Wikipedia page, retrieved from internet <https:/en.wiki/Motion_JPEG> on Nov. 6, 2018, 5 pages.

* cited by examiner

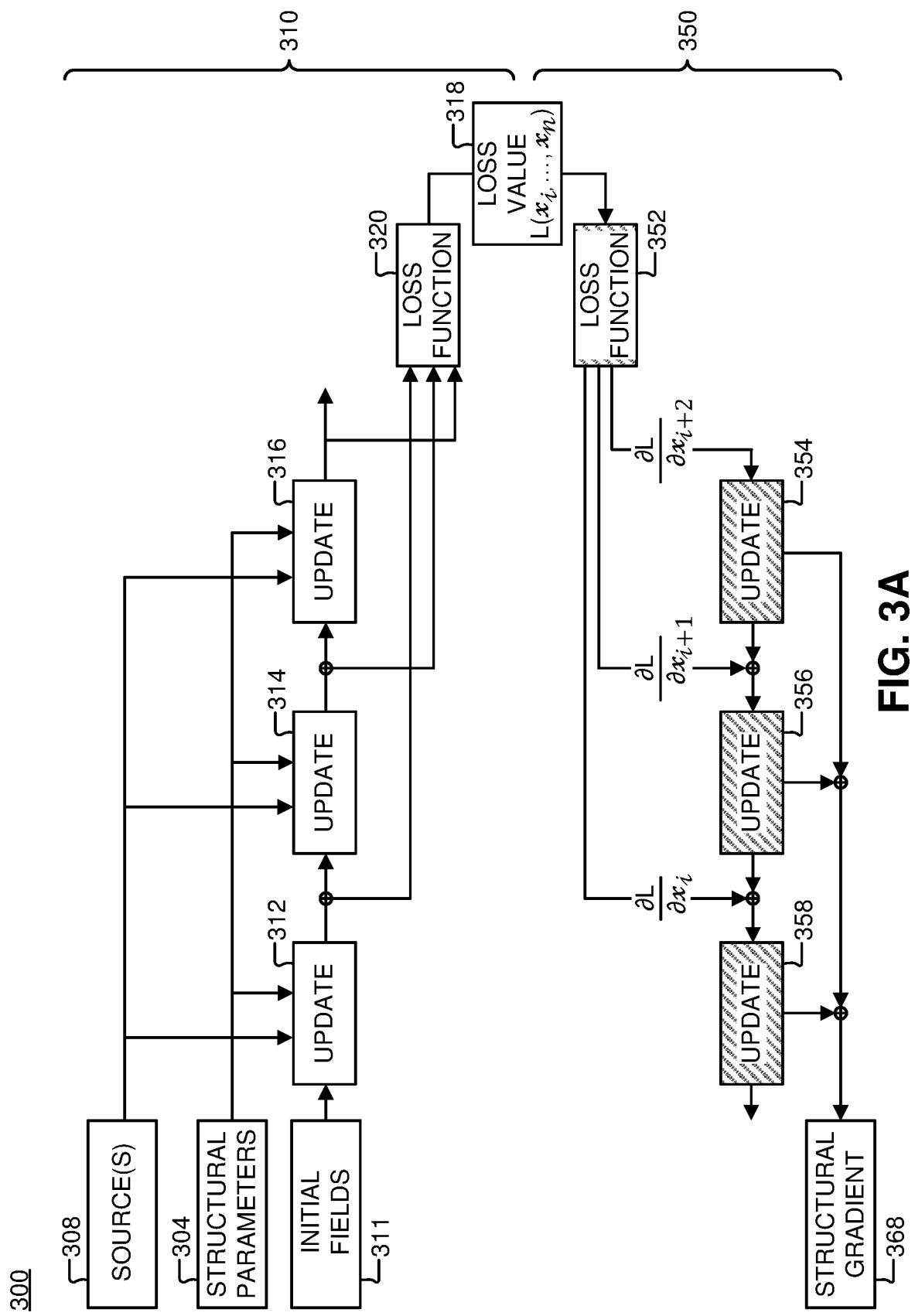

COMPRESSED FIELD RESPONSE REPRESENTATION FOR MEMORY EFFICIENT PHYSICAL DEVICE SIMULATION

TECHNICAL FIELD

This disclosure relates generally to design optimization of physical devices, such as, but not limited to, electromagnetic devices.

BACKGROUND INFORMATION

Electromagnetic devices (e.g., optical devices, electrical devices, or otherwise) are devices that create, manipulate, propagate, and/or measure electromagnetic radiation. Their applications vary broadly and include, but are not limited to, acousto-optic modulators, optical modulators, optical ring resonators, distributed Bragg reflectors, lasers, lenses, transistors, waveguides, antennas, and the like. Conventional techniques for the design of these devices are sometimes determined through a simple guess and check method in which a small number of design parameters of a predetermined design are adjusted for suitability to a particular application. However, in actuality, these devices may have design parameters ranging from hundreds all the way to many billions, dependent on the device size and functionality. As functionality of electromagnetic devices is increased and manufacturing tolerances improve to allow for smaller device feature sizes, it becomes increasingly important to take full advantage of these improvements via optimized device design.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 3A is a flow chart illustrating example time steps for time-forward simulation and backpropagation within a simulated environment, in accordance with an embodiment of the present disclosure.

DETAILED DESCRIPTION

Figure 1:
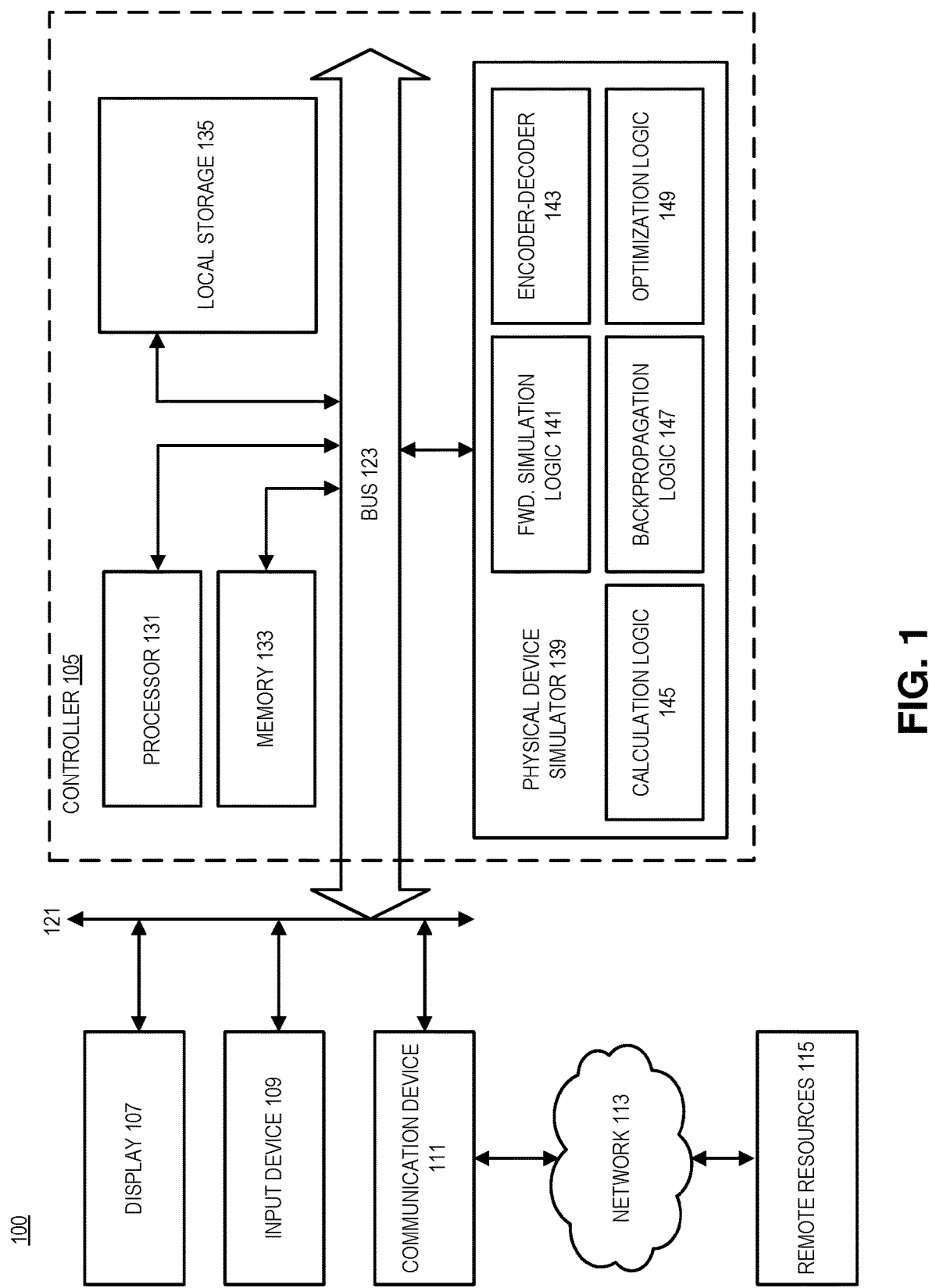
FIG. 1 is a functional block diagram illustrating a system for simulating and optimizing structural parameters of a physical device, in accordance with an embodiment of the disclosure.

Embodiments of a system, apparatus, and method for compressing the field response values of a physical device simulation are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Described herein are embodiments of a physics simulator utilized to optimize structural parameters (e.g., physical traits or characteristics) of electromagnetic and other physical devices based on first-principles simulations. In particular, the physics simulator allows for a first-principles based design and optimization of physical devices based on their optical, electrical, magnetic, acoustic, and/or fluidic response (e.g., field response) to an excitation source. The physics simulator utilizes partial-differential equation (PDE) systems to model these optical, electrical, mechanical, fluidic, quantum dynamic, and the like systems in a time-forward simulation, and optionally followed by backpropagation to determine the influence of structural parameters on a loss value of the physical device. However, the large state sizes (e.g., a physical device being represented in three-dimensions, or other dimensionality, by a quantity of voxels ranging from hundreds all the way to many billions) and simulation time steps (e.g., from hundreds to millions or billions of time steps) necessary to simulate these physical devices using the PDE systems and calculate performance gradients that are used for optimizing structural parameters may make the datasets intractable in terms of memory footprint for backpropagation, or even just the time-forward simulation.

To reduce the memory footprint for the time-forward simulations and optional backpropagation, compressed representations of the PDEs are leveraged to reduce the memory footprints while still storing the field response values (e.g., coefficient values describing the field response).

In some embodiments, the compression techniques described herein enable the full field responses for every simulation time step at every voxel to be stored. In other embodiments, the compression techniques include sub-sampling, which only stores the spatial and/or temporal resolution needed to adequately recreate via interpolation and represent the field responses. Encoding algorithms leveraged to compress the field response values may include learned autoencoders, spatial Fourier transform compression schemes (e.g., motion JPEG), motion-based compression schemes (e.g., keyframes and delta frames), or otherwise. Furthermore, one or more of these techniques may leverage known constraints that structural features of the physical devices place on the PDEs to further optimize encoding and compression of the field response values. The use of these compression schemes to reduce the memory footprint associated with storing the field response values of a time-forward simulation are described below. During backpropagation, these compressed representations can be decoded to calculate the performance gradients used for determining structural optimizations, as described below.

The physical device being optimized is described using an N dimensional array (e.g., N=1, 2, 3, or more) of voxels that each describe one or more structural parameters (e.g., index of refraction, dielectric constant, permeability, or other relevant physical characteristics) of the physical device at a respective position or locale in N dimensional space. In other words, in one embodiment, the structural parameters are defined at per voxel granularity. The initial description of the physical device to be optimized is further provided with a characterization of a desired input/output relationship such as a target output signal generated at an output region of the physical device in response to a source signal at a source region of the physical device. In various embodiments, operation of the physical device should be characterized by its field response to an excitation source, all of which are modeled using PDEs. In an embodiment where the physical device is an electromagnetic device (e.g., optical device, electrical device, etc.), the excitation source(s) and field response are characterized using Maxwell's equations and modelled using finite-difference-time-domain (FDTD) method (e.g., Yee's method) to discretize and model Maxwell's equations.

As mentioned above, the physics simulator allows for first-principles based design of novel devices with a reduced memory footprint (e.g., tractable) by modeling the field response of a physical device with PDE systems that may subsequently be encoded and compressed. This has applications in a wide variety of fields, including but not limited to, mechanical devices, optical devices, electromagnetic devices, quantum-dynamic devices, lasers, lenses, mechanical structures, transistors, and the like. This first-principles based design is not dependent on human intuition or expertise and generally may result in designs which outstrip current state-of-the-art designs as simultaneous, scalable optimization of a nearly unlimited number of design parameters may be achieved.

FIG. 1 is a functional block diagram illustrating system 100 for simulating and optimizing structural parameters of a physical device, in accordance with an embodiment of the disclosure. In the following embodiments, system 100 will be described in the context of simulating and optimizing an optical waveguide splitter as corresponding to the physical device. However, it is appreciated that the physical device is not limited to optical waveguides, and that other electromagnetic devices such as lasers, lenses, transistors, optical devices, quantum-dynamic devices, antennas, optoelectronic switches, mechanical structures, and the like may be represented by the term "physical device." System 100 provides first-principles based design and optimization of physical devices based on their optical, electrical, magnetic, acoustic, and/or fluidic response (e.g., field response) to an excitation source. In other words, it is appreciated that system 100 is not limited to modeling electromagnetic devices and that other devices having a field response to an excitation source may also be modeled and their structural parameters optimized. As long as the equations that describe the excitation source(s), field response, and output fields are differentiable (e.g., describable using partial differential equations), the techniques described herein may be applied.

As illustrated, system 100 includes a controller 105, a display 107, input device(s) 109, communication device(s) 111, network 113, remote resources 115, a bus 121, and a bus 123. The illustrated embodiment of controller 105 includes processor 131, memory 133, local storage 135, and a physical device simulator 139. The illustrated embodiment of physical device simulator 139 includes forward simulation logic 141, backpropagation logic 147, encoder-decoder 143, calculation logic 145, and optimization logic 149. It is appreciated that in some embodiments, controller 105 may be a distributed system. Furthermore, system 100 is merely one demonstrative system architecture, and other device architectures may be used.

Controller 105 is coupled to display 107 via buses 121 and 123 for displaying information to a user of system 100. Input device 109 is coupled to bus 123 through bus 121 for communicating information and command selections to processor 131. Input device 109 may include a mouse, trackball, keyboard, stylus, or other computer peripheral, to facilitate an interaction between the user and controller 105. In response, controller 105 may provide verification of the interaction through display 107.

Communication device 111 is provided for accessing remote resources 115 of a distributed system via network 113. Communication device 111 may include any of a number of networking peripheral devices such as those used for coupling to an Ethernet, token ring, Internet, a wide area network, or otherwise. Communication device 111 may further include a null-modem connection, or any other mechanism that provides connectivity between controller 105 and the outside world. Note that any or all of the components of system 100 illustrated in FIG. 1 and associated hardware may be used in various embodiments of the present disclosure. The remote resources 115 may be part of a distributed system and include any number of processors, memory, and other resources for optimizing the structural parameters of a physical device being simulated.

The controller 105 orchestrates the operation of the system 100 for optimizing the structural (e.g., physical) parameters of the physical device. Processor 131 (e.g., one or more central processing units, graphics processing units, and/or tensor processing units, etc.), memory 133 (e.g., volatile memory such as DRAM and SRAM, non-volatile memory such as ROM, flash memory, and the like), local storage 135 (e.g., magnetic memory such as computer disk drives), and the physical device simulator 139 are coupled to each other through bus 123. Controller 105 includes software logic (e.g., instructions included in memory 133) and/or hardware logic (e.g., application specific integrated circuits, field-programmable gate arrays, and the like) that when executed by controller 105 causes controller 105 or system 100 to perform operations. The operations may be based on instructions stored within any one of, or a combination of, memory 133, local storage 135, physical device simulator 139, and remote resources 115 accessed through network 113. In one embodiment, physical device simulator 139 represents a software architecture that is stored within memory 133 or local storage 135 and executed by processor 131.

In the illustrated embodiment, the modules 141-149 of the physical device simulator 139 are utilized to optimize the structural parameters of the physical device under design. In some embodiments, system 100 optimizes the structural parameters of the physical device via, inter alia, simulations (e.g., forward simulation and adjoint simulation) that utilize the FDTD method to model the field response (e.g., both electric and magnetic fields). Forward simulation logic 141 provides instructions for performing forward simulations (e.g., field propagations originating at a source region and evolving outward towards an output region) while back-propagation logic 147 provides instructions for performing an adjoint simulation. In one embodiment, the adjoint simulation models a reverse field response that back propagates a loss value from the output region towards the input region through the voxels of the simulated environment. The loss value is a scalar generated by a loss function that compares (e.g., takes a mean squared difference) a parameter of interest (e.g., power) in the field response to the same parameter in a target field response at a designated time step (e.g., last time step) and at a designated location within the simulation environment (e.g., at the output of the physical device). In other words, the loss value operates as a source to be used in the adjoint simulation. Calculation logic 145 implements the loss function and computes the loss value based upon the forward simulated field response and a target field response.

The time-forward simulation models a field response of the simulated environment in response to excitation source(s). This field response may be computed at each voxel for every simulation time step, and field response values describing the field response at each voxel for each simulation time step may need to be stored for future reference when optimizing the structural parameters of the voxels. The sheer size of these datasets can be intractable in original uncompressed form. Accordingly, Encoder-decoder 143 operates to encode the field response values into compressed field response values having a reduced memory footprint that represents a tractable dataset. When accessing the compressed field response values, encoder-decoder 143 also serves to decode the data and extract regenerated field response values.

The regenerated field response values may serve a number of purposes related to optimizing the structural parameters of the physical device. In one embodiment, the regenerated field response values may be used by calculation logic 145 to compute one or more performance gradients (e.g., a field gradient, a loss gradient, and a structural gradient) during a backpropagation structural optimization. A gradient descent algorithm may then be executed by optimization logic 149 using the calculated performance gradients to optimize one or more structural parameters. In other embodiments, the regenerated field response values may be used in other manners while optimizing the structural parameters of the physical device. For example, the regenerated field response values may be referenced for debugging purposes, post processing visualization, or otherwise.

Figure 2A:
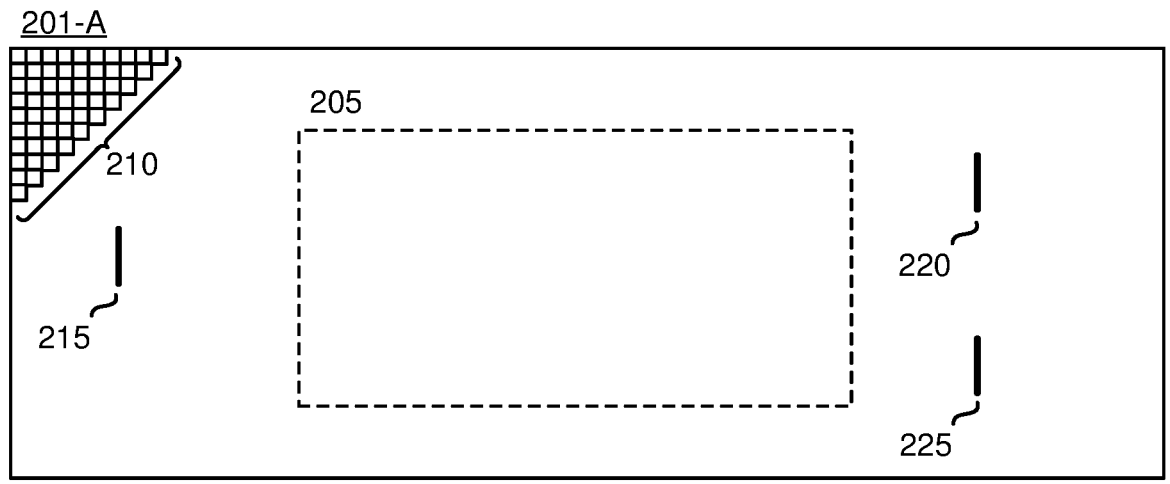
FIG. 2A illustrates a demonstrative simulated environment describing a physical device using an array of voxels, in accordance with an embodiment of the present disclosure.
Figure 2B:
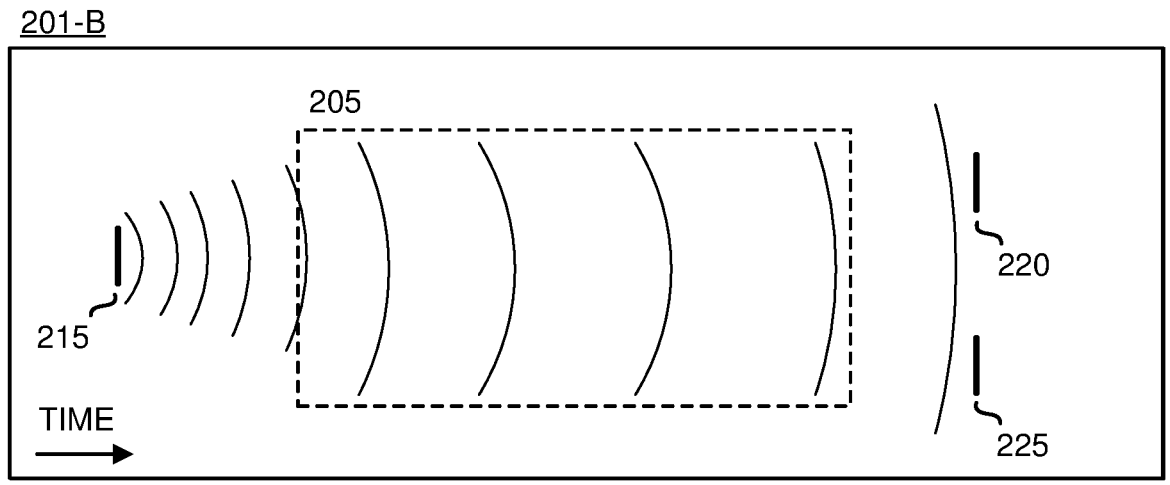
FIG. 2B illustrates an example time-forward simulation of a field response in a simulated environment in response to an excitation source, in accordance with an embodiment of the present disclosure.
Figure 2C:
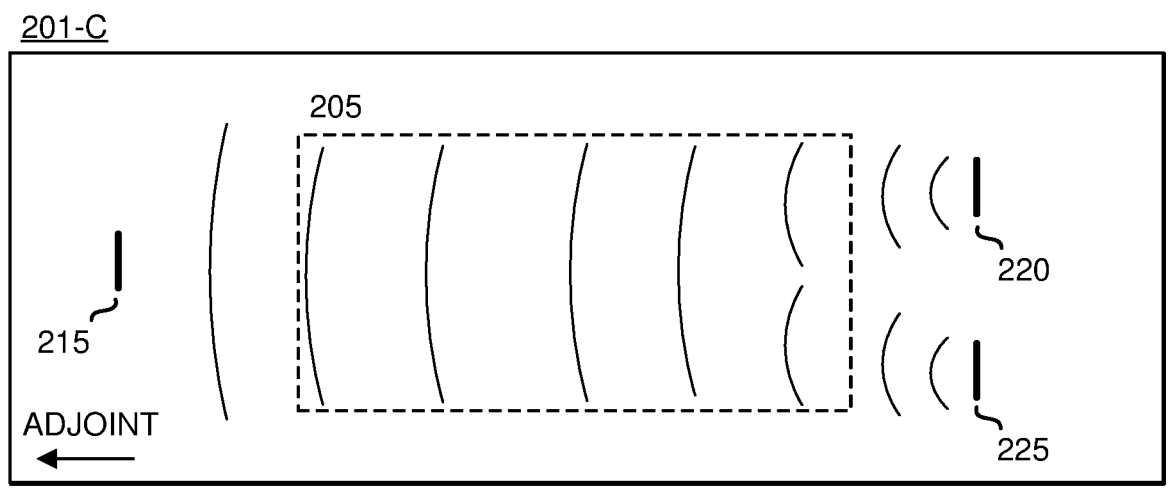
FIG. 2C illustrates an example backpropagation of a loss value within a simulated environment, in accordance with an embodiment of the present disclosure.

FIGS. 2A-2C illustrate an initial setup, a time-forward simulation, and backpropagation of a simulated environment 201 for optimizing structural parameters of a physical device. The simulated environment 201 and corresponding initial setup, time-forward simulation, adjoint simulation, and structural parameter optimization may be achieved via a physics simulator such as that described by system 100 illustrated in FIG. 1. As illustrated in FIGS. 2A-2C, the simulated environment is represented in two-dimensions, however it is appreciated that higher (e.g., 3-dimensional space) and lower (e.g., 1-dimensional space) dimensionality may also be used to describe the simulated environment 201 and physical device. In some embodiments, the optimization of the structural parameters of the physical device illustrated in FIGS. 2A-2C may be achieved via, inter alia, simulations (e.g., time-forward and adjoint) that utilizes a FDTD method to model the field response (e.g., both electric and magnetic).

FIG. 2A illustrates an example rendering of a simulated environment 201-A describing an electromagnetic device, in accordance with an embodiment of the present disclosure. The simulated environment 201-A represents the simulated environment 201 at an initial time step (e.g., an initial set up) for optimizing structural parameters of the physical device. The physical device described by the simulated environment 201 may correspond to an optical waveguide having a designable region 205 in which the structural parameters of the simulated environment may be designed, modified, or otherwise changed. The simulated environment 201 includes an excitation source 215 (e.g., a gaussian pulse, a wave, a waveguide mode response, and the like). The electrical and magnetic fields (e.g., field response) within the simulated environment 201 (and the physical device) may change in response to the excitation source 215. The specific settings of the initial structural parameters, excitation source, performance parameters, and other metrics (i.e., initial description) for a first-principles simulation of a physical device are input before the time-forward simulation starts. These specific values and parameters may be defined directly by a user (e.g., of the system 100 in FIG. 1), indirectly (e.g., via the controller 105 culling predetermined values stored in memory 133, local storage 135, or remote resources 115), or a combination thereof.

As illustrated, the simulated environment 201 (and subsequently the physical device) is described by a plurality of voxels 210, which represent individual elements of the two-dimensional (or three-dimensional) space of the simulated environment. Each of the voxels is illustrated as two-dimensional squares, however it is appreciated that the voxels may be represented as cubes or other shapes in three-dimensional space. It is appreciated that the specific shape and dimensionality of the plurality of voxels 210 may be adjusted dependent on the simulated environment 201. It is further noted that only a portion of the plurality of voxels 210 are illustrated to avoid obscuring other aspects of the simulated environment 201. Each of the plurality of voxels 210 is associated with one or more structural parameters, a field value to describe a field response, and a source value to describe the excitation source at a specific position within the simulated environment 201. The field response, for example, may correspond to a vector describing the electric and/or magnetic field at a particular time step for each of the plurality of voxels 210. More specifically, the vector may correspond to a Yee lattice that discretizes Maxwell's equations for determining the field response. In some embodiments, the field response is based, at least in part, on the structural parameters and the excitation source 215.

FIG. 2B illustrates an example time-forward simulation of the simulated environment 201-B describing the physical device, in accordance with an embodiment of the present disclosure. The rendered simulated environment 201-B represents the time-forward simulation at a particular time step in which the excitation source 215 is active (e.g., generating waves originating at the excitation source 215 that propagate through the simulated environment 201). In one embodiment, the physical device is an optical waveguide operating at the frequency of interest and having a particular waveguide mode (e.g., transverse electromagnetic mode, transverse electric mode, etc.) and the excitation source is at an input of the optical waveguide having a specified spatial, phase, and temporal profile. The time-forward simulation occurs over a plurality of time steps, including the illustrated time step. When performing the time-forward simulation, changes to the field response (e.g., the field value) for each of the plurality of voxels 210 are updated in response to the excitation source 215 and based, at least in part, on the structural parameters of the physical device at each of the plurality of time steps. Similarly, in some embodiments the source value is updated for each of the plurality of voxels (e.g., in response to the electromagnetic waves from the excitation source 215 propagating through the simulated environment). It is appreciated that the time-forward simulation is incremental and that the field value (and source value) is updated incrementally at each time step as time moves forward for each of the plurality of time steps. It is further noted that in some embodiments, the update is an iterative process and that the update of each field and source value is based, at least in part, on the previous update of each field and source value.

When performing the time-forward simulation, field response values describing the field response are generated and need to be stored in a memory efficient manner. Accordingly, in one embodiment, encoder-decoder 143 encodes the field response values for each voxel at each time step into compressed field response values. In one embodiment, all field response values for a given time step are group encoded and compressed together. In other embodiments, the group encoding may span multiple time steps. The loss function may subsequently compute a loss value based upon a difference between the field response and a target field response at each output port 220 and 225 at a designated time step (e.g. a final time step of the time-forward simulation). The loss value is a scalar that may be described in terms of a specific performance value (e.g., power in a specific waveguide mode). Structural parameters may be optimized for this specific performance value.

FIG. 2C illustrates an example backpropagation of the loss value backwards within the simulated environment 201-C describing the physical device, in accordance with an embodiment of the present disclosure. In one embodiment, the adjoint simulation, backpropagates the loss value at the output ports 220 and 225 as a reverse excitation source for stimulating a reverse field response through voxels 210 of simulated environment 201-C. The backpropagation of the loss value uses regenerated field response values decoded from the compressed field response values to determine an influence of changes in the structural parameters of voxels 210 on the loss value. Again, a change in the reverse field response of each of the plurality of voxels 210 is incrementally updated for each of the plurality of time steps backwards in time.

While performing the backpropagation of the loss value through the simulated environment, at least three performance gradients may be calculated. First, at each time step, a field gradient is calculated for each voxel based upon the regenerated field response values from the time-forward simulation. The field gradient relates a change in the field response to a change in a structural parameter. Second, also at each time step, a loss gradient is calculated for each voxel based upon the field response. The loss gradient relates a change in the loss value to a change in the forward field response. Third, a structure gradient is calculated for each voxel by combining the field gradients with the loss gradients for all time steps. The structure gradient relates a change in the loss value to a change in a structural parameter. The total structure gradient is then obtained by summing all the structure gradients from each time step.

In some embodiments, iterative cycles of the time-forward and adjoint simulations are performed successively using an optimization scheme such as gradient descent to adjust the structural parameters of the physical device. More specifically, after each of the cycles adjustments to the structural parameters (e.g., optimization) are made to reduce a particular loss value of the loss function. The time-forward simulation, backpropagation, and optimization are repeated successively until the loss value substantially converges or falls within a threshold of a target loss value.

FIG. 3A is a flow chart 300 illustrating example time steps for the time-forward simulation 310 and backpropagation 350 within a simulated environment, in accordance with an embodiment of the present disclosure. Flow chart 300 is one possible implementation that a system (e.g., system 100 of FIG. 1) may use to perform the time-forward simulation 310 and backpropagation 350 of the simulated environment (e.g., simulated environment 201 of FIGS. 2A-2C) describing an electromagnetic or other device. In the illustrated embodiment, the time-forward simulation utilizes a FDTD method to model the field response (both electric and magnetic) at a plurality of time steps in response to an excitation source. More specifically, the time-dependent Maxwell's equations (in partial differential form) are discretized to solve for field vector components (e.g. the field response of each of the plurality of voxels 210 of the simulated environment 201 in FIGS. 2A-2C) over a plurality of time steps.

Figure 3B:
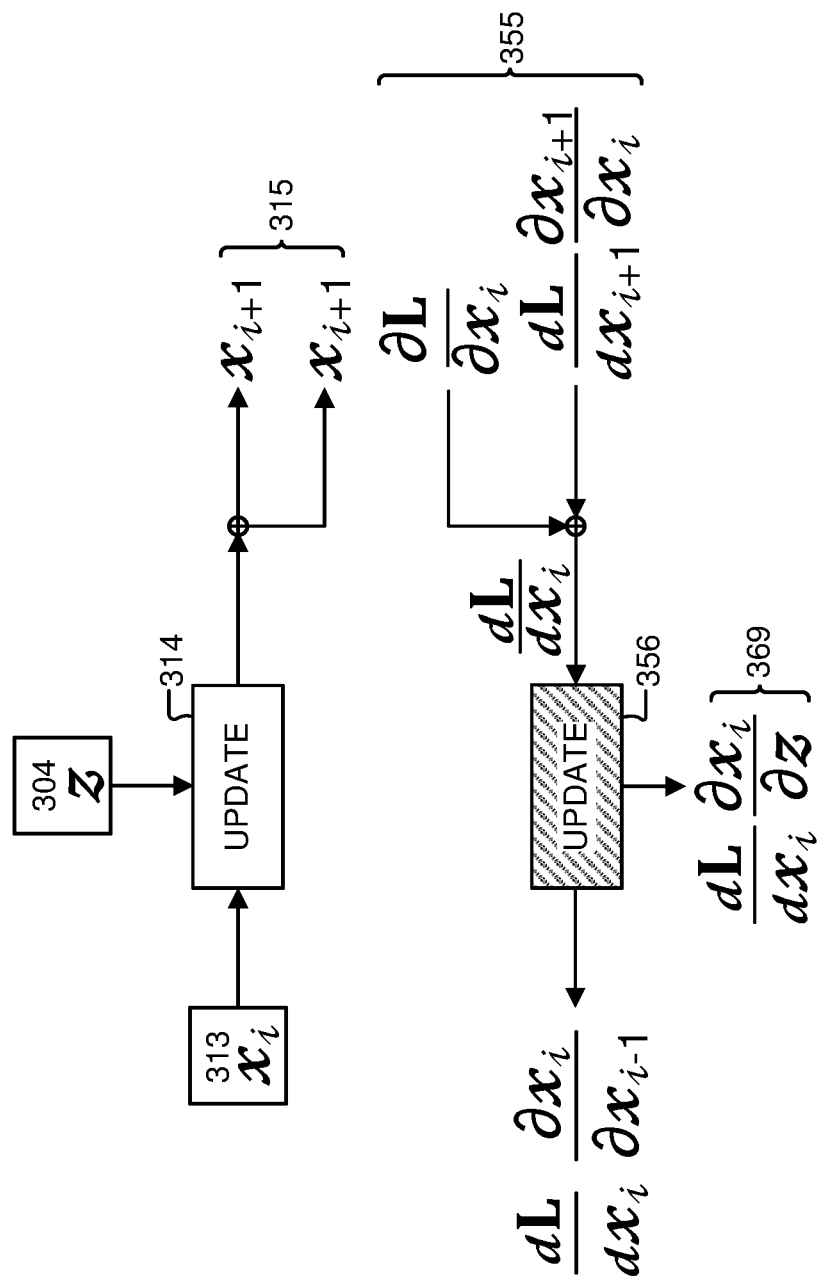
FIG. 3B is a chart illustrating a relationship between a time-forward simulation and backpropagation, in accordance with an embodiment of the present disclosure.

As illustrated in FIG. 3A, the flow chart 300 includes update operations for a portion of time-forward simulation 310 and backpropagation 350. Time-forward simulation 310 occurs over a plurality of time-steps (e.g., from an initial time step to a final time step over a pre-determined or conditional number of time steps having a specified time step size) and models changes (e.g., from the initial field values 311) in electric and magnetic fields of a plurality of voxels describing the simulated environment and/or physical device that collectively correspond to the field response. More specifically, update operations (e.g., 312, 314, and 316) are iterative and based on the field response, structural parameters 304, and one or more physical stimuli sources 308. Each update operation is succeeded by another update operation, which are representative of successive steps forward in time within the plurality of time steps. For example, update operation 314 updates the field values 313 (see, e.g., FIG. 3B) based on the field response determined from the previous update operation 312, sources 308, and the structural parameters 304. Similarly, update operation 316 updates the field values 315 (see, e.g., FIG. 3B) based on the field response determined from update operation 314. In other words, at each time step of the operational simulation the field values (and thus field response) are updated based on the previous field response and structural parameters of the physical device. Once the final time step of the time-forward simulation 310 is performed, the loss value 318 may be determined (e.g., based on a pre-determined loss function 320).

The loss gradients determined from block 352 may be treated as adjoint or excitation sources (e.g., physical stimuli or excitation source originating at an output region) which are backpropagated in reverse (from the final time step incrementally through the plurality of time steps until reaching the initial time step) to determine structural gradient 368.

In the illustrated embodiment, the FDTD solve (e.g., time-forward simulation 310) and backpropagation 350 problem are described pictorially, from a high-level, using only "update" and "loss" operations as well as their corresponding gradient operations. The simulation is set up initially in which the structure parameters, the excitation source, and the initial field states of the simulated environment (and electromagnetic device) are provided. As discussed previously, the field states are updated in response to the excitation source based on the structural parameters. More specifically, the update operation is given by $\phi$, where $x_{i+1} = \phi(x_i, b_i, z)$ for $i = 1, \ldots, n$ Here, $n$, corresponds to the total number of time steps (e.g., the plurality of time steps) for the time-forward simulation, $x$ corresponds to the field response (the field value associated with the electric and magnetic fields of each of the plurality of voxels) of the simulated environment at time step $i$, $b$ corresponds to the excitation source(s) (the source value associated with the electric and magnetic fields for each of the plurality of voxels) of the simulated environment at time step $i$, and $z$ corresponds to the structural parameters describing the topology and/or material properties of the electromagnetic device.

It is noted that using the FDTD method, the update operation can specifically be stated as:

$$\phi(x, b, z) = A(z) x + B(z) b. \quad (1)$$

That is to say the FDTD update is linear with respect to the field and source terms. Concretely, $A(z) \in \mathbb{R}^{N \times N}$ and $B(z) \in \mathbb{R}^{N \times N}$ are linear operators which depend on the structure parameters, $z$, and act on the fields, $x$, and the sources, $b$ respectively. Here, it is assumed that $x, b \in \mathbb{R}^N$ where N is the number of FDTD field components in the time-forward simulation. Additionally, the loss operation is given by $L = (x, \ldots, x_n)$, which takes as input the computed fields and produces a single, real-valued scalar (e.g., the loss value) that can be reduced and/or minimized.

In terms of optimizing the structural parameters of the electromagnetic device, the relevant quantity to produce is $$\frac{dL}{dz},$$

which is used to describe the change in the loss value with respect to a change in the structural parameters of the electromagnetic device and is denoted as the "structural gradient" illustrated in FIG. 3A.

FIG. 3B is a chart 380 illustrating the relationship between the update operation for the time-forward simulation and the backpropagation, in accordance with an embodiment of the present disclosure. More specifically, FIG. 3B summarizes the time-forward and backpropagation relationships that are involved in computing $$\frac{dL}{dz},$$

which include $$\frac{\partial L}{\partial x_i}, \frac{\partial x_{i+1}}{\partial x_i}, \frac{dL}{dx_i},$$

and $$\frac{\partial x_i}{\partial z}.$$

The update operation 314 updates the field values 313, $x$, based on the structural parameters 305, $z$, to the next field values 315, $x_{+1}$. The gradients 355 are utilized to determine $$\frac{dL}{dx_i}$$

for the backpropagation update operation 356 backwards in time) which combined with the gradients 369 are used, at least in part, to calculate $$\frac{dL}{dz}.$$

$$\frac{dL}{dx_i}$$

is the contribution of each Held to L. It is noted that this is the partial derivative, and therefore does not take into account the causal relationship of $x_i \to x_{+1}$. Thus, $$\frac{\partial x_{i+1}}{\partial x_i}$$

is utilized which encompasses the $x_i \to x_{+1}$ relationship. The loss gradient, $$\frac{dL}{dx_i}$$

is also used to compute the structural gradient, $$\frac{dL}{dz}$$

and corresponds to the total derivative of the field with respect to loss value L. The loss gradient $$\frac{dL}{dx_i},$$

at a particular time step, $i$, is equal to the summation of $$\frac{\partial L}{\partial x_i} + \frac{dL}{dx_{i+1}} \frac{\partial x_{i+1}}{\partial x_i}.$$

Finally, $$\frac{\partial x_i}{\partial z},$$

which corresponds to the field gradient, is used which is the contribution to $$\frac{dL}{dz}$$

from each time/update step.

In particular, the memory footprint to directly compute $$\frac{\partial L}{\partial x_i}$$

and $\frac{dL}{dz}$ is so large that it is intractable to store more than a handful of state Tensors. The state Tensor corresponds to storing the values of all of the FDTD cells (e.g., the plurality of voxels) for a single simulation time step. (It is appreciated that the term "tensor" may refer to tensors in a mathematical sense or as described by the TensorFlow framework developed by Alphabet, Inc. In some embodiments the term "tensor" refers to a mathematical tensor which corresponds to a multidimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws.) For example, for the general loss function $f$, it may be necessary to store the fields, $x$, for all time steps, $i$. This is because, for most choices of $f$, the gradient will be a function of the arguments of $f$. This difficulty is compounded by the fact that the values of $$\frac{\partial L}{\partial x_i}$$

for larger values of $i$ are needed before the values for smaller $i$, which may prevent the use of schemes that attempt to store only the values $$\frac{\partial L}{\partial x_i},$$

at the immediate time step.

An additional difficulty in performing the backpropagation without a compressed representation is further illustrated when computing $\frac{dL}{dz}$, which is given by:

$$\frac{dL}{dz} = \sum_i \frac{dL}{dx_i} \frac{\partial x_i}{\partial z}. \qquad (2)$$

For completeness, the full form of the first time in the sum, $\frac{dL}{dz}$, is expressed as:

$$\frac{dL}{dx_i} = \frac{\partial L}{\partial x_i} + \frac{dL}{dx_{i+1}} \frac{\partial x_{i+1}}{\partial x_i}. \qquad (3)$$

Based on the definition of $\phi$ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 356), which can be expressed as:

$$\frac{dL}{dx_i} = \frac{\partial L}{\partial x_i} + \frac{dL}{dx_{i+1}} A(z), \qquad (4)$$

or $$\nabla_{x_i} L = A(z)^T \nabla_{x_{i+1}} L + \frac{\partial L^T}{\partial x_i}. \qquad (5)$$

The adjoint update is the backpropagation of the loss gradients from later to earlier time steps and may be referred to as a backwards solve for $$\frac{dL}{dx_i}.$$

The second term in the sum of the structural gradient, $$\frac{dL}{dz},$$

corresponds to the field gradient and is denoted as:

$$\frac{\partial x_i}{\partial z} = \frac{d\phi(x_{i-1}, \textbf{\textit{b}}_{i-1}, z)}{dz} = \frac{dA(z)}{dz} x_{i-1} + \frac{dB(z)}{dz} \textbf{\textit{b}}_{i-1}, \qquad (6)$$

for the particular form of $\phi$ described by equation (1). Thus, without reduced representation, each term of the sum associated $$\frac{dL}{dz}$$

depends on both $$\frac{dL}{dx_{i_0}}$$

for $i >= i_0$ and $x_o$ for $i < i_o$. Since the dependency chains of these two terms are in opposite directions, it is concluded that computing $$\frac{dL}{dz}$$

in this way also requires the storage of $x$ values for all of $i$, which may be intractable, without compressing the field response values as described below.

Figure 4:
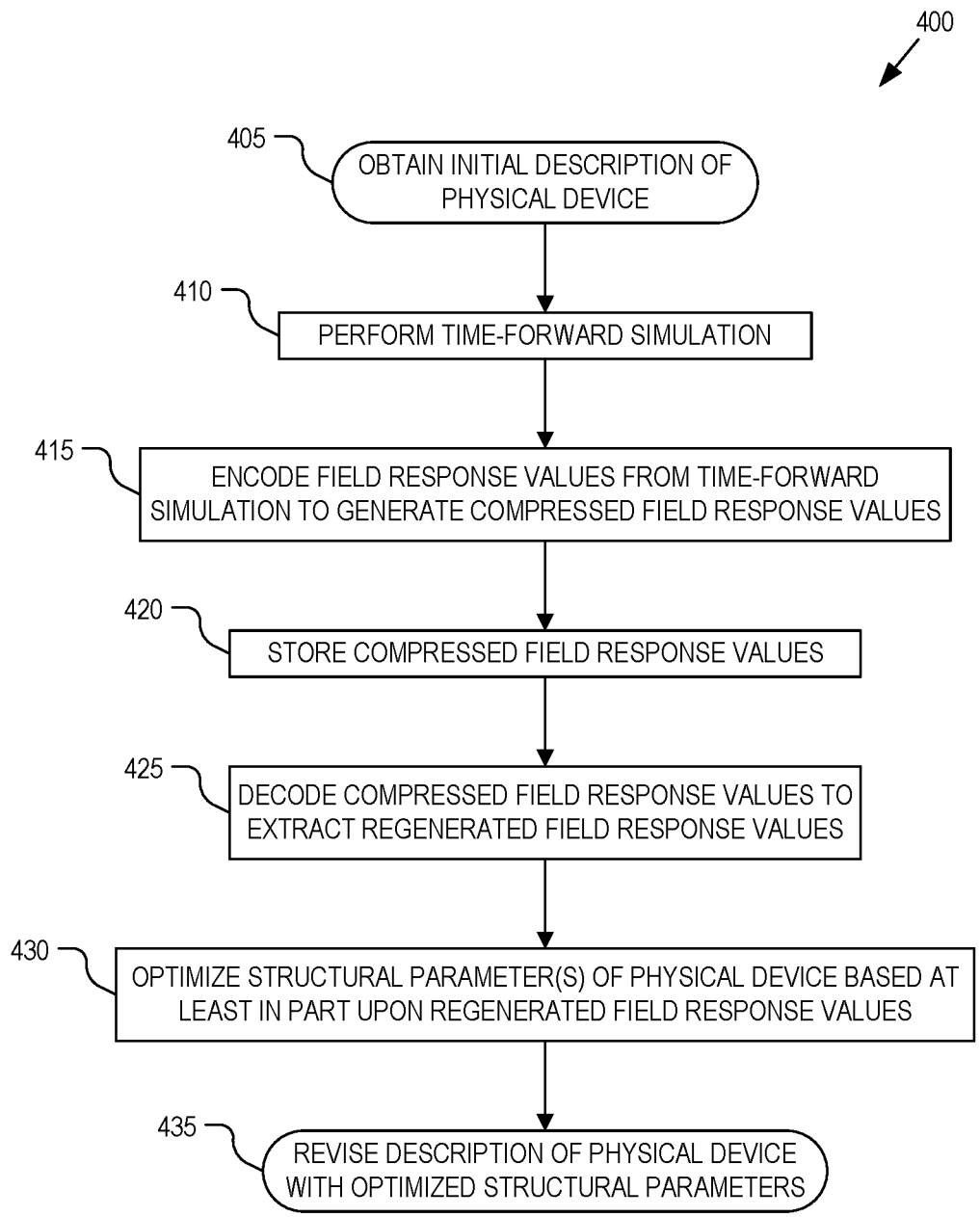
FIG. 4 is a flow chart illustrating a process for simulating and optimizing a physical device and leverages compression of the field response values to make memory consumption tractable, in accordance with an embodiment of the present disclosure.

FIG. 4 is a flow chart illustrating a process 400 for simulating and optimizing a physical device and leveraging compression of the field response values to make memory consumption tractable, in accordance with an embodiment of the present disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

In a process block 405, an initial description of the physical device is obtained, and simulated environment 201-A established. In one embodiment, the initial description includes a description of the structural parameters for each voxel 210 along with a desired input/output relationship including a target output field response (e.g., at output ports 220 and 225) generated in response to an excitation source (e.g., at input port 215). Voxels 210 may be defined in N-dimensional space (e.g., 3 dimensional space or otherwise) with each voxel corresponding to a different location within the N-dimensional space.

With the physical device established in simulated environment 201 based upon the initial description, the time-forward simulation is executed for some number of time steps (process block 410). The time-forward simulation calculates the field response propagating through the physical device from the excitation source(s) to the output. As the field response propagates through simulated environment 201, it interacts with each voxel 210 and the structural parameters of those voxels influence how the field response propagates (e.g., absorption, transmission, refraction, reflection, resonance, etc.). As mentioned above, an FDTD method with discretized Maxwell's equations is used to simulate the field response.

As the FDTD method is used to simulate the field response, field response values describing the field response at each voxel 210 for each time step are generated. For example, these field response values may be considered coefficient values of the discretized Maxwell's equations for each voxel 210 per simulation time step of the time-forward simulation. For each time step, the collective field response values for all voxels 210 represent a snapshot in simulation time of the overall field response within the physical device and/or simulated environment 201. These field response values over many time steps may consume vast amounts of memory, and in some cases, may even represent an intractable dataset that consumes an impractical amount of memory. Accordingly, in a process block 415, the field response values are encoded to generate compressed field response values, which are then stored to memory with a reduced (and tractable) memory footprint relative to storing the original unencoded field response values (process block 420). Although process block 415 is illustrated as a separate block from performing the time-forward simulation in process block 410, it should be appreciated that encoding the field response values may be implemented contemporaneously with the time-forward simulation at each time step.

Figure 6:
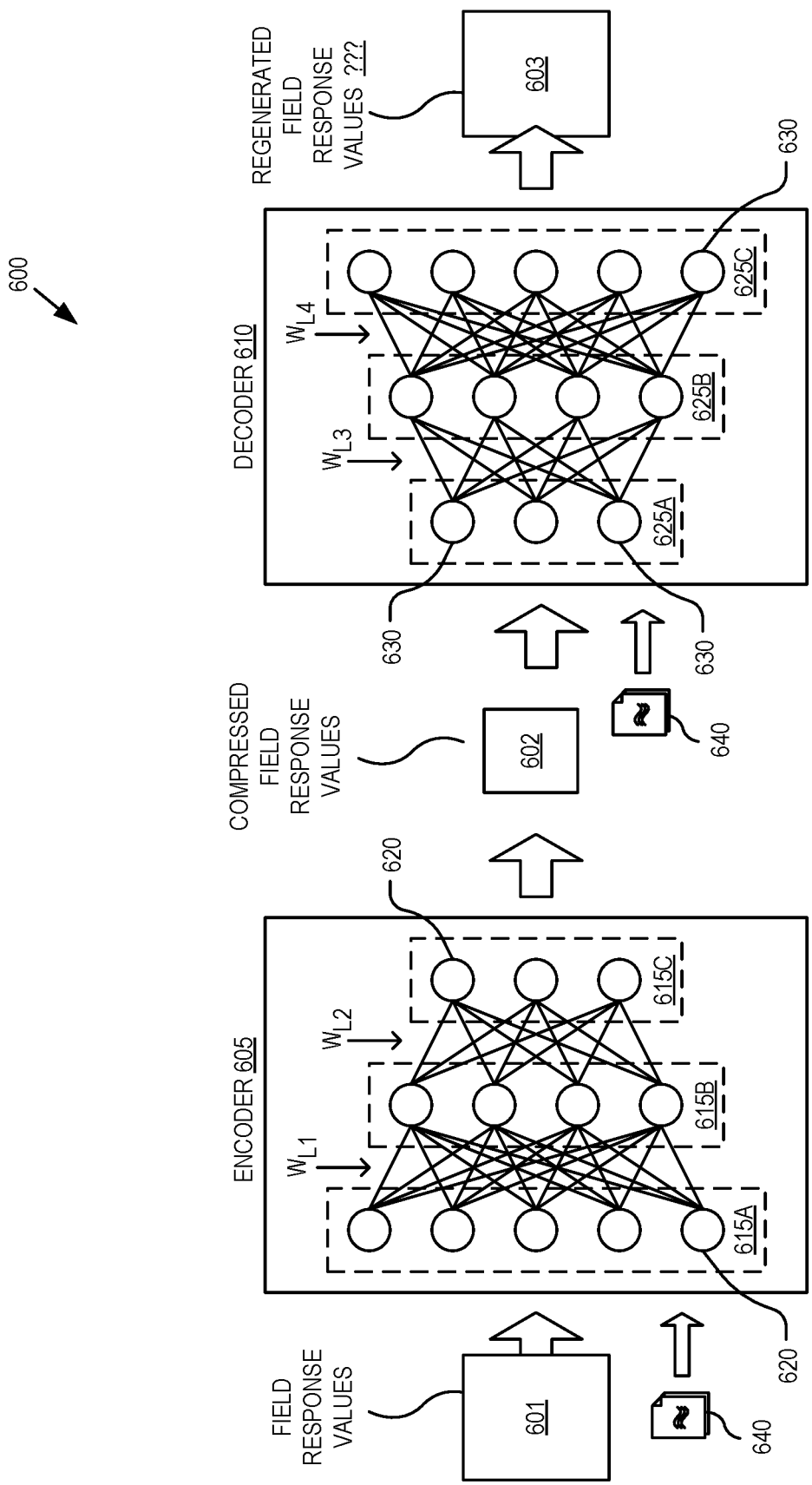
FIG. 6 illustrates the use of a learned autoencoder for compressing field response values in a time-forward simulation, in accordance with an embodiment of the present disclosure.

The field response values may be encoded by encoder-decoder 143 using a machine learning algorithm, such as a learned autoencoder. For example, in one embodiment, the learned autoencoder is a multi-layer convolution encoder. In some embodiments, the learned autoencoder solely analyses the field response values when encoding the data; however, in other embodiments, the learned autoencoder may accept various other inputs to further optimize the compression. For example, the learned autoencoder may accept the descriptions of the structural features of the physical device to leverage constraints such features would naturally place on Maxwell's equations (e.g., boundary conditions, likely oscillation frequencies and harmonics based upon physical dimensions and refractive indices, etc.) and thus increase the compression ratio of the encoding. FIG. 6 illustrates an example multi-layer learned autoencoder 600. In one embodiment, encoder-decoder 143 may implement one or more compression algorithms for encoding the field response values, such as, a spatial Fourier transform based compression scheme (e.g., a motion JPEG compression scheme), a motion-based compression scheme that uses keyframes interleaved with sets of consecutive delta frames (e.g., see FIG. 7), sub-sampling schemes (e.g., spatial sub-sampling and/or temporal sub-sampling), or otherwise. In various embodiments, the compression rate may be varied during the course of simulation to tradeoff fidelity of the regenerated field response values with rapid calculation of the compressed field values. It is anticipated that one or more of the above encoding schemes may be used together to encode the field response values. For example, the learned autoencoder may be configured to implement a spatial Fourier transform based compression scheme, a motion-based compression scheme, a sub-sampling scheme, or otherwise. These and other features of the operation of encoder-decoder 143 are discussed in further detail below.

Once the field response values have been encoded (process block 415) and stored as compressed field response values (process block 420), the compressed field response values may be decoded at a later time (process block 425) using encoder-decoder 143 to extract regenerated field response values. The regenerated field response values may be used to facilitate optimization of the structural parameters of one or more voxels 210 (process block 430). The optimization may be executed to achieve a particular design goal (e.g., achieve a particular input-output relationship), reduce parasitic losses, debug design flaws, etc. For example, the optimization executed in process block 430 may represent a backpropagation optimization (see FIG. 5), extraction of relevant temporal and/or spatial field responses for debugging/optimizing, field response visualization (e.g., post processing visualization), or otherwise.

Once the structural parameters related to one or more voxels 210 have been revised to achieve a particular design goal, a revised description of the physical device is generated and saved (process block 435). In some embodiments, a machine learning algorithm may be used to iteratively optimize the structural parameters of voxels 210, which may lead to nonintuitive physical structures that operate in a specifically optimized manner. For example, the revised description may include revised dimensional features, entirely new physical features, omission of previous physical features, material property changes (e.g., changes in: material types or characteristics, refractive indices, permittivities, material densities, etc.), or otherwise.

Figure 5:
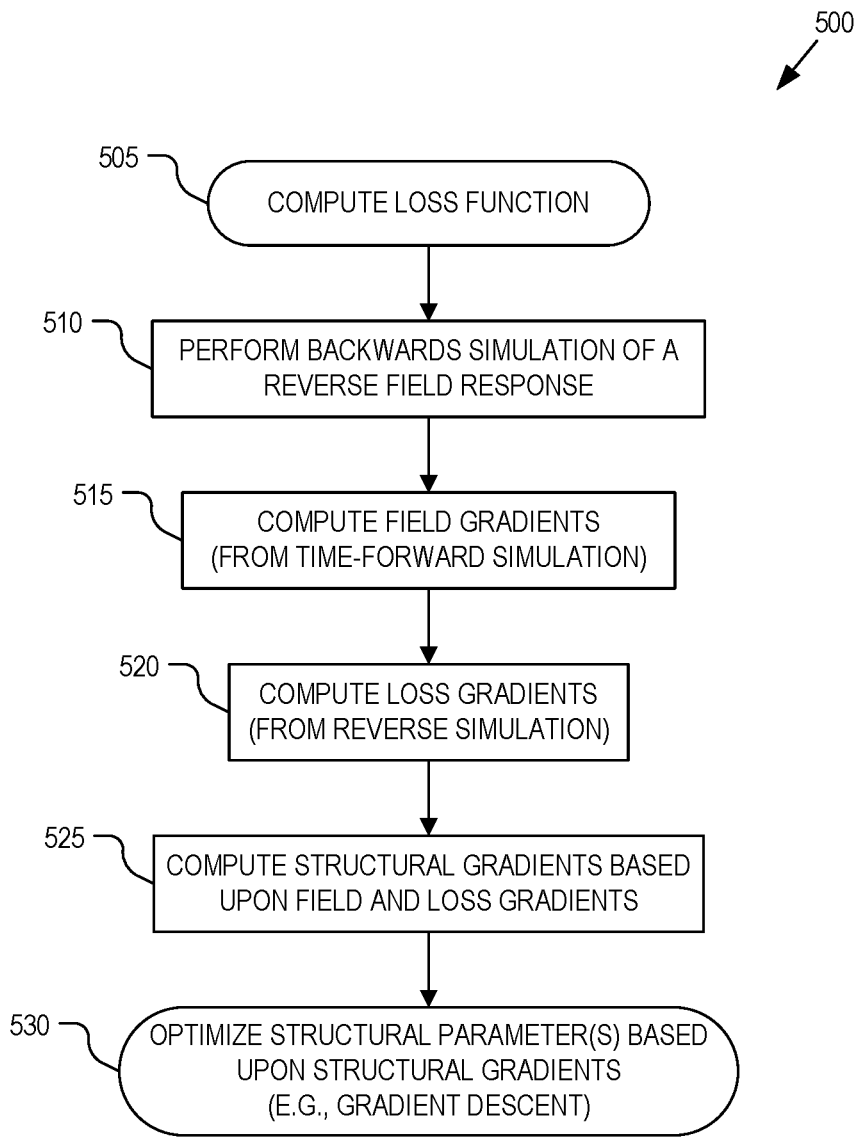
FIG. 5 is a flow chart illustrating a backpropagation structural optimization, in accordance with an embodiment of the present disclosure.

FIG. 5 is a flow chart illustrating a process 500 for backpropagation structural optimization, in accordance with an embodiment of the present disclosure. Process 500 represents one possible implementation of process block 430 in FIG. 4 for optimizing structural parameters of the physical device under design. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

In a process block 505, the loss function associated with the physical device under design is computed. As discussed above, the loss function may be characterized as a difference between the field response and a target field response at a designated time step (e.g., final time step) and at a designated location within the simulated environment (e.g., output ports 220 and 225). The loss function may further be characterized in terms of a particular design parameter that is being optimized (e.g., power in a specific waveguide mode). In one embodiment, the loss function is represented as a vector and can resemble an excitation source in form, which can then serve as the excitation source of a reverse field response for the purposes of backpropagation.

In a process block 510, backpropagation logic 147 performs the backwards simulation of the reverse field response that back propagates the loss function through voxels 210 from output ports 220, 225 to input port 215.

In process blocks 515-525, a number of performance gradients are computed based upon outputs from the time-forward and adjoint simulations. In process block 515, a field gradient for each voxel 210 at each time step is calculated, as described above, based upon the regenerated field response values from the time-forward simulation. The field gradient is a derivative or partial derivative of the forward field response with respect to the structure (e.g., structural parameters) of the physical device. In process block 520, a loss gradient for each voxel 210 at each time step is calculated, as described above, based upon the reverse field response (backpropagation of the loss value). The loss gradient is a derivative or partial derivative of the loss function with respect to the forward field response. In process block 525, a structural gradient for each voxel 210 at each time step is calculated, as described above, based upon combining the field gradient with the loss gradient. The structure gradient is a derivative or partial derivative of the loss function with respect to the structure. Finally, in process block 530, one or more structural parameters are revised (e.g., optimized) using the structural gradient. In one embodiment, a gradient descent algorithm is executed for each optimization. It should be appreciated that backpropagation structural optimization is an iterative process that re-executes the forward simulation and backpropagation between cycles of structural optimization.

FIG. 6 illustrates the use of a learned or trained autoencoder 600 for compressing field response values 601 of a time-forward simulation, in accordance with an embodiment of the present disclosure. Autoencoder 600 represents one possible implementation of encoder-decoder 143 illustrated in FIG. 1. The illustrated embodiment of autoencoder 600 includes encoder 605 and decoder 610. The illustrated encoder 605 includes multiple neural network layers 615A-C including an input layer 615A, a hidden layer 615B, and an output layer 615C. Each neural network layer 615 includes a plurality of nodes 620 having weighted connections (e.g., $W_{L1}$, $W_{L2}$, etc.) to other nodes 620 in other layers. Similarly, decoder 610 includes multiple neural network layers 625A-C including an input layer 625A, a hidden layer 625B, and an output layer 625C having nodes 630 interconnected via weighted connections (e.g., $W_{L3}$, $W_{L4}$, etc.) to other nodes 630 in other layers. Although FIG. 6 illustrates a two-dimensional (2D) neural network for simplicity of illustration, in one embodiment, autoencoder 600 is a convolutional autoencoder and therefore may include a multi-dimensional (e.g., 3D or more) neural network.

During operation, field response values 601 for a given simulation time step are fed into encoder 605 and output as compressed field response values 602, which occupy a smaller memory footprint relative to field response values 601. Subsequently, when compressed field response values 602 are to be used (e.g., for backpropagation), decoder 610 extracts regenerated field response values 603 from compressed field response values 602.

In one embodiment, encoder 605 and/or decoder 610 may be provided with a description 640 of structural features of the physical device. Providing the structural features enables autoencoder 600 to leverage constraints that the structural features inherently place on field response values 601 (e.g., boundary conditions due to physical boundaries, spectral frequencies and harmonics due to physical dimensions, etc.) to further reduce the memory footprint associated with compressed field response values 602. In one embodiment, the weighted connections ($W_{L1}$, $W_{L2}$, $W_{L3}$, $W_{L4}$, etc.) may be initialized based upon the structural features. For example, the physical dimensions of structural features in the physical device will influence the field response and the expected spatial frequencies used to encode field response values 601. Accordingly, in one embodiment, weights associated with periodic activation functions within nodes 620 (or 630) are initialized to correspond to expected spatial frequencies in the field response.

Figure 7:
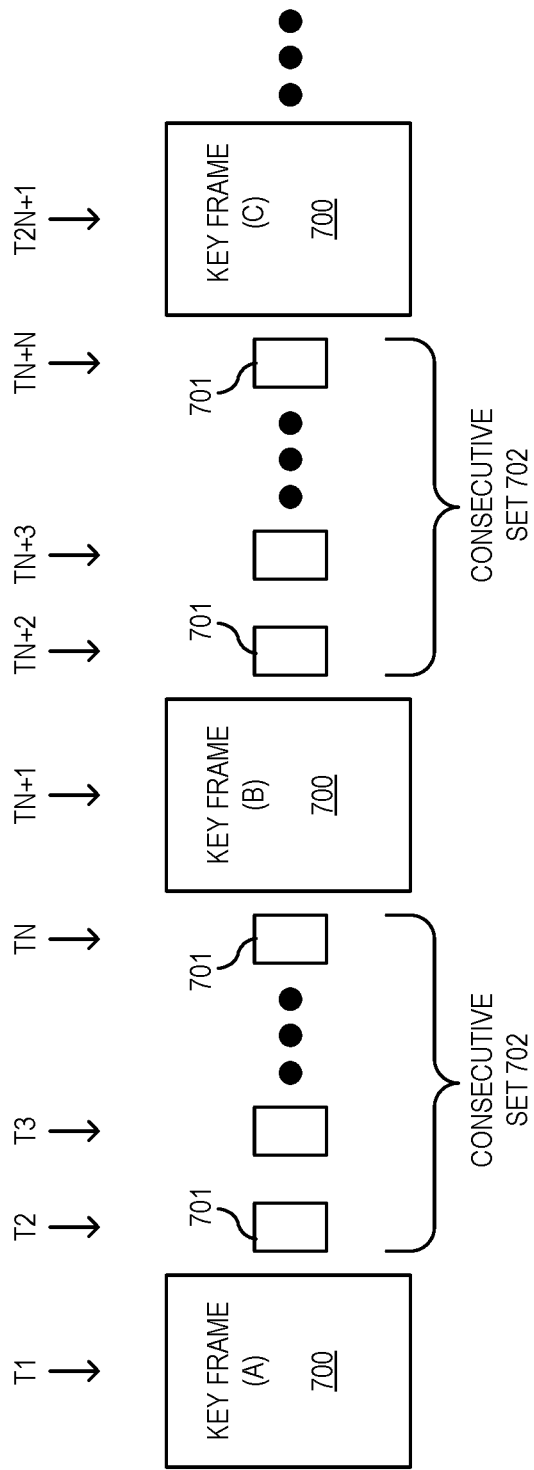
FIG. 7 illustrates the use of keyframes and delta frames for compressing field response values in a time-forward simulation, in accordance with an embodiment of the present disclosure.

FIG. 7 illustrates the use of keyframes 700 and delta frames 701 for compressing field response values in a time-forward simulation, in accordance with an embodiment of the present disclosure. In yet another embodiment, encoder-decoder 143 may encode a time series dataset of the field response values using keyframes 700 interleaved with sets 702 of consecutive delta frames 701. Each keyframe 700 represents a high resolution encoding (e.g., high resolution snapshot image) of the field response values at a determined time step. Delta frames 701 represent delta vectors describing the changes in the field response values relative to the immediately preceding keyframe 700. Each delta frame 701 encodes the changes in the field response values that occurred in a given time step after the preceding keyframe 700. Accordingly, delta frames 701 encode sequential changes and by summing the changes described in each keyframe 701 back to the preceding keyframe 700, the field response values at any given time can be decoded. In one embodiment, an autoencoder is used to evaluate changes in the field response values to determine how long a given consecutive set 702 of delta frames 701 should be extended before creating a new keyframe 700. Accordingly, the number of delta frames 701 within each set 702 may be variable and dynamically changed based upon feedback from an autoencoder analyzing changes in the field response values themselves.

The use of keyframes and delta frames is a sort of motion-based compression scheme. However, other types of motion-based compression schemes may also be used. For example, a spatial Fourier transform may be used to encode and compress the time changing field response values. A motion-JPEG compression scheme is an example of a spatial Fourier transform that may be implemented.

In yet other embodiments, sub-sampling techniques may be used to encode and compress the field response values. For example, spatial sub-sampling may be used to sparsely encode the field response values in one or more regions of the simulated environment where the field response values have a lower spatial variation relative to other regions. In other words, only a portion of voxels 210 falling in regions where the field response values spatially vary slowly are encoded and interpolation may be used when decoding. Similarly, temporal sub-sampling may be used to sparsely encode the field response values during time steps when the field response values have lower temporal variation. Again, temporal interpolation may be used to fill in the temporal gaps when decoding. Accordingly, temporal sub-sampling may be used to encode field response values in regions where the field response has entered a steady state mode, while continuing to fully encode the field response values in regions experiencing rapid transient fluctuations. Adaptive modulation of the compression rate may further be applied as a proxy for, or in combination with, spatial/temporal sub-sampling.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A computer-implemented method of optimizing structural parameters of a physical device, the method comprising:
    receiving an initial description of the physical device that describes the physical device with an array of voxels that each describe one or more of the structural parameters of the physical device in a corresponding location in an N dimensional space, wherein N=1, 2, 3, or more;
    performing a time-forward simulation of a field response propagating through the physical device and interacting with the voxels in a simulated environment, wherein the field response is generated in response to an excitation source in the simulated environment, wherein the field response is influenced by the structural parameters of the voxels;
    generating field response values describing the field response at each of the voxels for each of a plurality of time steps of the time-forward simulation;
    encoding the field response values to generate compressed field response values;
    storing the compressed field response values with a reduced memory footprint relative to storing the field response values;
    decoding one or more of the compressed field response values to extract regenerated field response values; and
    generating a revised description of the physical device having at least one of the structural parameters of at least one of the voxels optimized based at least upon the regenerated field response values.

2. The computer-implemented method of claim 1, wherein generating the revised description of the physical device comprises performing a backpropagation structural optimization using the regenerated field response values, the backpropagation structural optimization comprising:
    computing a loss value based at least on a difference between the field response and a target field response;
    performing a backwards simulation of a reverse field response that back propagates the loss value through the voxels in the simulated environment;
    computing a field gradient for a given voxel based upon one or more of the regenerated field response values;
    computing a loss gradient for the given voxel based upon the reverse field response;
    generating a structural gradient for the given voxel by combining the field gradient with the loss gradient; and
    revising one or more of the structural parameters at the given voxel based at least upon the structural gradient.

3. The computer-implemented method of claim 2, wherein the loss value is based upon the difference between the field response and the target field response at a designated time step and a designated location within the simulated environment.

4. The computer-implemented method of claim 1, wherein encoding the field response values to generate the compressed field response values comprises:
    encoding the field response values with a learned autoencoder.

5. The computer-implemented method of claim 4, wherein encoding the field response values to generate the compressed field response values further comprises:
    inputting structural features of the physical device into the learned autoencoder to leverage constraints that the structural features place on the field response to further reduce the memory footprint associated with the compressed field response values.

6. The computer-implemented method of claim 4, further comprising:
    initializing weights associated with periodic activation functions of the learned autoencoder to correspond to expected spatial frequencies in the field response, wherein the expected spatial frequencies are determined based at least upon physical dimensions of structural features in the physical device that influence the field response.

7. The computer-implemented method of claim 1, wherein encoding the field response values to generate the compressed field response values comprises:

encoding the field response values with a spatial Fourier transform based compression scheme.

8. The computer-implemented method of claim 7, wherein the spatial Fourier transform based compression scheme comprises a JPEG compressing scheme.

9. The computer-implemented method of claim 1, wherein encoding the field response values to generate compressed field response values comprises:
    encoding the field response values with a motion-based compression scheme that uses keyframes at determined time steps and delta frames between the keyframes describing changes in the field response values relative to the keyframes.

10. The computer-implemented method of claim 9, further comprising:
    executing an autoencoder to evaluate when to create a given one of the keyframes at one of the determined time steps after a consecutive set of the delta frames, wherein a number of the delta frames between consecutive ones of the keyframes is variable based upon evaluation of the autoencoder.

11. The computer-implemented method of claim 1, wherein encoding the field response values to generate compressed field response values comprises:
    spatially sub-sampling the field response values in a first region of the simulated environment where the field response values have a lower spatial variation than another region of the simulated environment.

12. At least one non-transitory computer-readable storage medium that provides instructions that, when executed by a machine, will cause the machine to perform operations comprising:
    receiving an initial description of a physical device that describes the physical device with an array of voxels that each describe one or more structural parameters of the physical device in a corresponding location in a N-dimensional space, wherein N=1, 2, 3, or more;
    performing a time-forward simulation of a field response propagating through the physical device and interacting with the voxels in a simulated environment, wherein the field response is generated in response to an excitation source in the simulated environment, wherein the field response is influenced by the structural parameters of the voxels;
    generating field response values describing the field response at each of the voxels for each of a plurality of time steps of the time-forward simulation;
    encoding the field response values to generate compressed field response values;
    storing the compressed field response values with a reduced memory footprint relative to storing the field response values;
    decoding one or more of the compressed field response values to extract regenerated field response values; and
    generating a revised description of the physical device having at least one of the structural parameters of at least one of the voxels optimized based at least upon the regenerated field response values.

13. The least one non-transitory computer-readable storage medium of claim 12, wherein generating the revised description of the physical device comprises performing a backpropagation structural optimization, the backpropagation structural optimization comprising:
    computing a loss value based at least on a difference between the field response and a target field response;
    performing a backwards simulation of a reverse field response that back propagates the loss value through the voxels in the simulated environment;
    computing a field gradient for a given voxel based upon one or more of the regenerated field response values;
    computing a loss gradient for the given voxel based upon the reverse field response;
    generating a structural gradient for the given voxel by combining the field gradient with the loss gradient; and
    revising one or more of the structural parameters at the given voxel based at least upon the structural gradient.

14. The least one non-transitory computer-readable storage medium of claim 13, wherein the loss value is based upon the difference between the field response and the target field response at a designated time step and a designated location within the simulated environment.

15. The least one non-transitory computer-readable storage medium of claim 12, wherein encoding the field response values to generate the compressed field response values comprises:
    encoding the field response values with a learned autoencoder.

16. The least one non-transitory computer-readable storage medium of claim 15, wherein the learned autoencoder comprises a multi-layer convolution encoder.

17. The least one non-transitory computer-readable storage medium of claim 15, wherein encoding the field response values to generate the compressed field response values further comprises:
    inputting structural features of the physical device into the learned autoencoder to leverage constraints that the structural features place on the field response to further reduce the memory footprint associated with the compressed field response values.

18. The least one machine accessible non-transitory computer-readable storage medium of claim 15, further comprising:
    initializing weights associated with periodic activation functions of the learned autoencoder to correspond to expected spatial frequencies in the field response, wherein the expected spatial frequencies are determined based at least upon physical dimensions of structural features in the physical device that influence the field response.

19. The least one non-transitory computer-readable storage medium of claim 12, wherein encoding the field response values to generate the compressed field response values comprises:
    encoding the field response values with a spatial Fourier transform based compression scheme.

20. The least one non-transitory computer-readable storage medium of claim 19, wherein the spatial Fourier transform based compression scheme comprises a JPEG compressing scheme.

21. The least one non-transitory computer-readable storage medium of claim 12, wherein encoding the field response values to generate compressed field response values comprises:
    encoding the field response values with a motion-based compression scheme that uses keyframes at determined time steps and delta frames between the keyframes describing changes in the field response values relative to the keyframes.

22. The least one non-transitory computer-readable storage medium of claim 21, further comprising:
  executing an autoencoder to evaluate when to create a given one of the keyframes at one of the determined time steps after a consecutive set of the delta frames,
  wherein a number of the delta frames between consecutive ones of the keyframes is variable based upon evaluation of the autoencoder.

23. The least one non-transitory computer-readable storage medium of claim 12, wherein encoding the field response values to generate compressed field response values comprises:
  spatially sub-sampling the field response values in a first region of the simulated environment where the field response values have a lower spatial variation than another region of the simulated environment.

24. The least one non-transitory computer-readable storage medium of claim 12, wherein encoding the field response values to generate compressed field response values comprises:
  temporally sub-sampling the field response values during a first group of time steps when the field response values have a lower temporal variation across the first group of time steps relative to other time steps.

* * * * *

UNITED STATES PATENT AND TRADEMARK OFFICE
CERTIFICATE OF CORRECTION

PATENT NO. : 11,501,169 B1
APPLICATION NO. : 16/398697
DATED : November 15, 2022
INVENTOR(S) : M. Schubert et al.

Page 1 of 1

It is certified that error appears in the above-identified patent and that said Letters Patent is hereby corrected as shown below:

In the Claims

| Column | Line | |
|--------|------|---|
| 19 | 61 | change "The least" to -- The at least -- |
| 20 | 12 | change "The least" to -- The at least -- |
| 20 | 17 | change "The least" to -- The at least -- |
| 20 | 25 | change "The least" to -- The at least -- |
| 20 | 28 | change "The least" to -- The at least -- |
| 20 | 37 | change "The least" to -- The at least -- |
| 20 | 38 | change "one machine-accessible non-transitory" to -- one non-transitory -- |
| 20 | 48 | change "The least" to -- The at least -- |
| 20 | 54 | change "The least" to -- The at least -- |
| 20 | 59 | change "The least" to -- The at least -- |
| 21 | 1 | change "The least" to -- The at least -- |
| 21 | 9 | change "The least" to -- The at least -- |
| 21 | 17 | change "The least" to -- The at least -- |

Signed and Sealed this
Twenty-seventh Day of June, 2023

Katherine Kelly Vidal
*Director of the United States Patent and Trademark Office*